United States Patent
Ku

(10) Patent No.: US 8,258,853 B2
(45) Date of Patent: Sep. 4, 2012

(54) POWER SWITCH CIRCUIT FOR TRACING A HIGHER SUPPLY VOLTAGE WITHOUT A VOLTAGE DROP

(75) Inventor: Wei-Ming Ku, Taipei County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 229 days.

(21) Appl. No.: 12/815,387

(22) Filed: Jun. 14, 2010

(65) Prior Publication Data

US 2011/0304381 A1 Dec. 15, 2011

(51) Int. Cl.
*H03K 17/00* (2006.01)
(52) U.S. Cl. .......................................... 327/408; 327/407
(58) Field of Classification Search ................. 327/407, 327/408, 409, 410
See application file for complete search history.

(56) References Cited

U.S. PATENT DOCUMENTS

| 5,966,043 | A  | * | 10/1999 | Jinbo ............................. 327/530 |
| 6,359,497 | B1 | * | 3/2002  | Criscione ...................... 327/408 |
| 6,566,935 | B1 | * | 5/2003  | Renous .......................... 327/408 |
| 6,774,704 | B2 | * | 8/2004  | Kushnarenko ................ 327/530 |
| 7,423,472 | B2 | * | 9/2008  | Hirose et al. .................. 327/407 |
| 7,928,793 | B2 | * | 4/2011  | Lee et al. ....................... 327/407 |

\* cited by examiner

*Primary Examiner* — Hai L Nguyen
(74) *Attorney, Agent, or Firm* — Winston Hsu; Scott Margo

(57) ABSTRACT

A power switch circuit includes a voltage selecting circuit, an auxiliary transistor and a control circuit. The control circuit includes an inverter, or a first inverter and a second inverter forming a latch. The power switch circuit is capable of tracing a higher supply voltage and outputting the voltage level of the higher supply voltage without a voltage drop, so the junction leakage can be eliminated and the drive capability of the power switch circuit is ensured.

8 Claims, 7 Drawing Sheets

| Voltage / Signals | V | V | V | V |
|---|---|---|---|---|
| VDD | 3.3 | 3.3 | 3.3 | 3.3 |
| VPP | 0 | 6.5 | 3.3 | Floating |
| VPPI | 3.3 | 6.5 | 3.3-Vtp | 3.3 |

FIG. 2 PRIOR ART

| Voltage\Signals | V | V | V | V |
|---|---|---|---|---|
| VDD | 3.3 | 3.3 | 3.3 | 3.3 |
| VPP | 0 | 6.5 | 3.3 | Floating |
| ZEN | 3.3 | 0 | 0 | Unknown |
| VPPI | 3.3 | 6.5 | 3.3 | Fail |

FIG. 4

| Signals \ Voltage | V | V | V | V |
|---|---|---|---|---|
| VDD | 3.3 | 3.3 | 3.3 | 3.3 |
| VPP | 0 | 6.5 | 3.3 | Floating |
| ZEN | 3.3 | 0 | 0 | 3.3 |
| VPPI | 3.3 | 6.5 | 3.3 | 3.3 |

FIG. 6

POWER SWITCH CIRCUIT FOR TRACING A HIGHER SUPPLY VOLTAGE WITHOUT A VOLTAGE DROP

BACKGROUND OF THE INVENTION

1. Field of the Invention

The present invention is related to a power switch circuit capable of tracing a higher supply voltage, and more particularly, to a power switch circuit capable of tracing a higher supply voltage without a voltage drop, so as to prevent junction leakage as well as ensuring the drive capability of the power switch circuit.

2. Description of the Prior Art

Please refer to FIG. 1. FIG. 1 is a diagram illustrating a conventional voltage selecting circuit 10. The conventional voltage selecting circuit 10 comprises a first P-type Metal Oxide Semiconductor (PMOS) 11 and a second PMOS 12. The source end of the first PMOS 11 is coupled to a power voltage VDD and to a gate end of the second PMOS 12; the source end of the second PMOS 12 is coupled to a programming voltage VPP and to the gate end of the first PMOS 11. The body ends of the first PMOS 11 and the second PMOS 12 are coupled to the drain ends of the first PMOS 11 and the second PMOS 12, respectively. The drain end of the first PMOS 11 is coupled to the drain end of the second PMOS 12, for generating an output voltage VPPI. In applications such as memory devices where the conventional voltage selecting circuit 10 is utilized, the voltage level of the power voltage VDD is usually fixed at approximately 3.3 volts (V); the voltage level of the programming voltage VPP is usually approximately 0V, 3.3V, or 6.5V depending on the operation mode such as read mode or program mode.

Please refer to FIG. 1 and FIG. 2 together. FIG. 2 is a table illustrating the voltage level of the output voltage VPPI under different conditions of the power voltage VDD and the programming voltage VPP for the conventional voltage selecting circuit 10. When the voltage level of the power voltage VDD is 3.3V and the voltage level of the programming voltage VPP is 0V, the first transistor 11 is turned on, so the voltage level of the output voltage VPPI equals to that of the power voltage VDD, which is 3.3V. When the voltage level of the power voltage VDD is 3.3V and the voltage level of the programming voltage VPP is 6.5V, the second transistor 12 is turned on, so the voltage level of the output voltage VPPI equals to that of the programming voltage VPP, which is 6.5V. This way the voltage selecting circuit 10 is able to select/trace the higher voltage out of the power voltage VDD and the programming voltage VPP. However, the conventional voltage selecting circuit 10 is unable to accurately trace high in certain conditions. For instances, when the voltage levels of the power voltage VDD and the programming voltage VPP are both 3.3V, the first transistor 11 and the second transistor 12 are not turned on, so the current flows through the junction between the source end and the body end of each of the transistors 11 and 12. Therefore, the voltage level of the output voltage VPPI equals $(3.3V-V_{TP})$, wherein $V_{TP}$ represents the threshold voltage of the first PMOS 11 and the second PMOS 12. The threshold voltage $V_{TP}$ is usually around 0.7V so the voltage level of the output voltage VPPI is only $(3.3V-0.7V)=2.6V$, when both of the power voltage VDD and the programming voltage VPP are 3.3V. Further, when the voltage level of the programming voltage VPP is floating, the programming voltage VPP can be any of the above voltage level but usually the programming voltage VPP tends to be low so it is assumed that the programming voltage VPP is lower than 3.3V. In other words, when the voltage level of the power voltage VDD is 3.3V and the voltage level of the programming voltage VPP is floating (i.e. usually lower than 3.3V), the first transistor 11 is turned on, so the voltage level of the output voltage VPPI equals to that of the power voltage VDD, which is 3.3V.

It is observed that the inability of the conventional voltage selecting circuit 10 to accurately trace high when the power voltage VDD approximately equals the programming voltage VPP (i.e. 3.3V) sometimes causes current leakage from the power voltage VDD to the ground terminal VSS due to the parasitic PNP junction occurring within the first transistor 11 and/or the second transistor 12. Also, another concern is that when the conventional voltage selecting circuit 10 is utilized as the power source to turn on a switch, the output voltage VPPI of $(3.3V-V_{TP})$ may not be fully sufficient to turn on the switch and resulting in leakage current $I_{OFF}$ especially when the switch is also a MOS, causing inconvenience to the users.

SUMMARY OF THE INVENTION

An embodiment of the present invention discloses a power switch circuit. The power switch circuit comprises a voltage selecting circuit, a control circuit and a pass stage. The voltage selecting circuit comprises a first PMOS and a second PMOS. The first PMOS has a source end coupled to a first voltage source, a gate end coupled to a second voltage source, a drain end and a body end coupled to the drain end. The second PMOS has a source end coupled to the second voltage source, a gate end coupled to the first voltage source, a drain end coupled to the drain end of the first PMOS, and a body end coupled to the drain end of the second PMOS. The control circuit has an input end coupled to the second voltage source. The pass stage is coupled to the voltage selecting circuit and an output end of the control circuit.

Another embodiment of the present invention discloses a power switch circuit. The power switch circuit comprises a voltage selecting circuit, a control circuit, and a pass stage. The voltage selecting circuit comprises a first PMOS and a second PMOS. The first PMOS has a source end coupled to a first voltage source, a gate end coupled to a second voltage source, a drain end and a body end coupled to the drain end. The second PMOS has a source end coupled to the second voltage source, a gate end coupled to the first voltage source, a drain end coupled to the drain end of the first PMOS, and a body end coupled to the drain end of the second PMOS. The control circuit has an input end coupled to the second voltage source. The pass stage is coupled to the voltage selecting circuit. The pass stage comprises an auxiliary PMOS having a source end coupled to the second voltage source, a gate end coupled to an output end of the control circuit, a drain end coupled to the drain end of the first PMOS, and a body end coupled to the drain end of the auxiliary PMOS.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a table illustrating the voltage level of the output voltage under different conditions of the power voltage and the programming voltage for the voltage selecting circuit in FIG. 1.

FIG. 4 is a table illustrating the voltage level of the output voltage under different conditions of the power voltage and the programming voltage for the power switch circuit in FIG. 3.

FIG. 6 is a table illustrating the voltage level of the output voltage under different conditions of the power voltage and the programming voltage for the power switch circuit in FIG. 5.

DETAILED DESCRIPTION

Therefore, one of the purposes of the present invention is to disclose a power switch circuit which is capable of selecting a higher supply voltage without the threshold voltage drop when the power voltage approximately equals the programming voltage, so as to prevent junction leakage as well as ensuring the drive capability of the power switch circuit.

Figure 1:
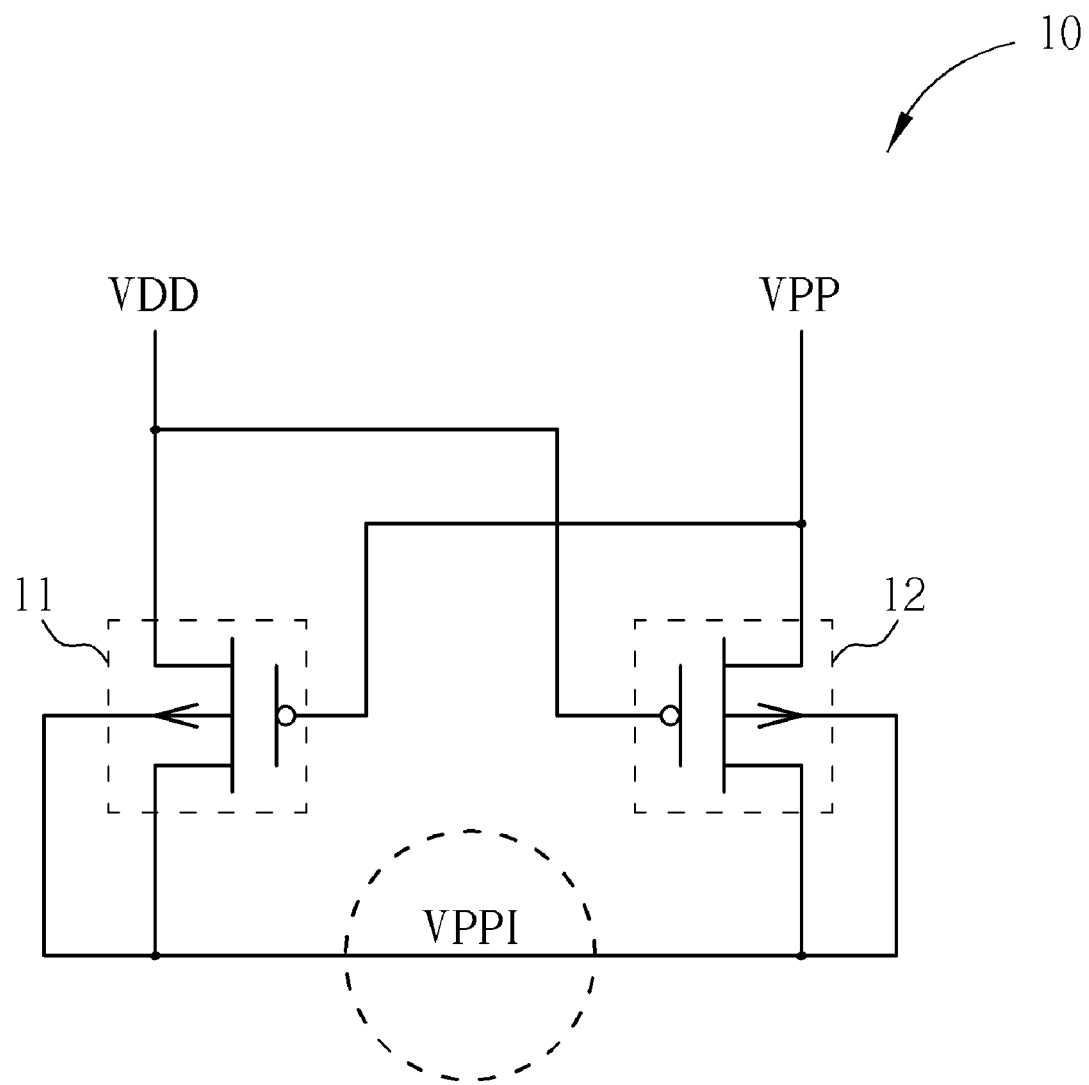
FIG. 1 is a diagram illustrating a conventional voltage selecting circuit.
Figure 3:
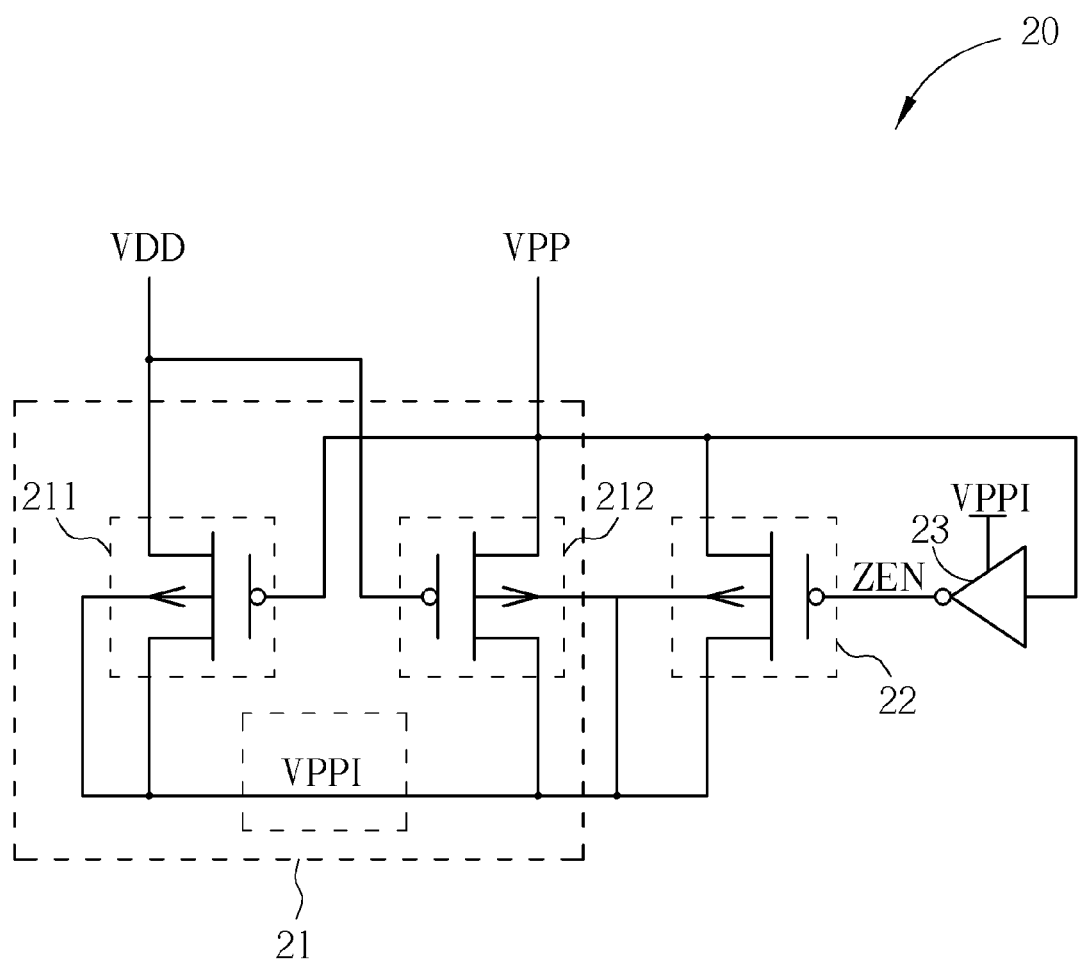
FIG. 3 is a diagram illustrating a power switch circuit according to the first embodiment of the present invention.

Please refer to FIG. 3. FIG. 3 is a diagram illustrating a power switch circuit 20 according to the first embodiment of the present invention. The power switch circuit 20 comprises a voltage selecting circuit 21, an auxiliary PMOS 22 and a control circuit 23. The voltage selecting circuit 21 comprises a first PMOS 211, a second PMOS 212 and an output voltage VPPI. The structure and the operational principle of the voltage selecting circuit 21 is similar to that of the conventional voltage selecting circuit 10 mentioned above, so the relative description is omitted hereinafter. The control circuit 23 is realized with an inverter in the present embodiment. The auxiliary PMOS 22 acts as a pass stage between the voltage selecting circuit 21 and the control circuit 23. The source end of the auxiliary PMOS 22 is coupled to the gate end of the first PMOS 21, the source end of the second PMOS 12, the programming voltage VPP and an input end of the control circuit 23 together. The body end of the auxiliary PMOS 22 is coupled to the body end and the drain end of the second PMOS 212 (wherein the drain end of the second PMOS 212 is coupled to the output voltage VPPI), and the drain end of the auxiliary PMOS 22 together. The gate end of the auxiliary PMOS 22 is coupled to an output end ZEN of the control circuit 23.

Please refer to FIG. 3 and FIG. 4 together. FIG. 4 is a table illustrating the voltage level of the output voltage VPPI under different conditions of the power voltage VDD and the programming voltage VPP for the power switch circuit 20 of the first embodiment of the present invention. When the voltage level of the power voltage VDD is 3.3V and the voltage level of the programming voltage VPP is 0V, the first transistor 211 is turned on, so the voltage level of the output voltage VPPI equals to that of the power voltage VDD, which is 3.3V. The input end of the control circuit 23 is coupled to the programming voltage VPP, so the control circuit 23 performs logic inversion to the programming voltage VPP (0V) for the output end ZEN to output 3.3V, which will not turn on the auxiliary PMOS 22. When the voltage level of the power voltage VDD is 3.3V and the voltage level of the programming voltage VPP is 6.5V, the second transistor 212 is turned on. Further the control circuit 23 performs logic inversion to the programming voltage VPP (6.5V) for the output end ZEN to output 0V, the auxiliary PMOS 22 is also turned on. Since the source ends of the second transistor 212 and the auxiliary PMOS 22 are both coupled to the programming voltage VPP, the voltage level of the output voltage VPPI equals to that of the programming voltage VPP, which is 6.5V. When both of the voltage level of the power voltage VDD and the programming voltage VPP are 3.3V, the first transistor 21 and the second transistor 22 are not turned on. The control circuit 23 performs logic inversion to the programming voltage VPP (3.3V) for the output end ZEN to output 0V, the auxiliary PMOS 22 is turned on accordingly. This way, the voltage drop of the threshold voltage $V_{TP}$ of the first transistor 211 and the second transistor 212 can be eliminated as the current of the programming voltage VPP does not flow through the junctions of the first PMOS 211 and second PMOS 212, but via the auxiliary PMOS 22. In other words, the voltage level of the output voltage VPPI is no longer (3.3V–$V_{TP}$), but 3.3V when the power voltage VDD the programming voltage VPP are both 3.3V.

However, when the voltage level of the programming voltage VPP is floating, the output ZEN of the control circuit 23 is unknown so consequently the output voltage cannot be determined. Therefore, the power switch circuit 20 is capable of selecting/tracing the higher voltage out of the power voltage VDD and the programming voltage VPP, and outputting the programming voltage VPP without the voltage drop of the threshold voltage when the power voltage VDD equals the programming voltage VPP; but the power switch circuit 20 is unable to determine the output voltage VPPI when the voltage level of the programming voltage VPP is floating.

Figure 5:
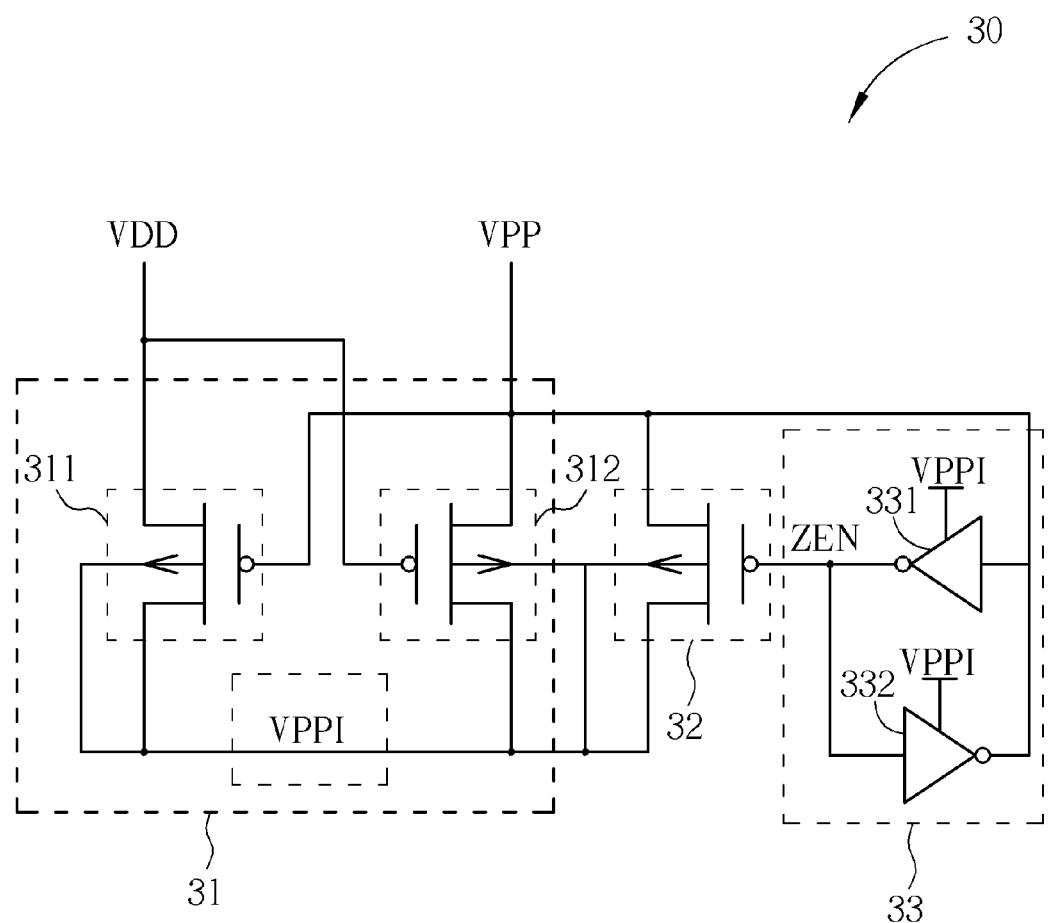
FIG. 5 is a diagram illustrating a power switch circuit according to the second embodiment of the present invention.

Please refer to FIG. 5. FIG. 5 is a diagram illustrating a power switch circuit 30 according to the second embodiment of the present invention. The power switch circuit 30 comprises a voltage selecting circuit 31, an auxiliary PMOS 32, and a control circuit 33. The voltage selecting circuit 31 comprises a first PMOS 311, a second PMOS 312 and an output voltage VPPI. The structure and the operational principle of the voltage selecting circuit 31 and the auxiliary PMOS 32 are similar to that of the power switch circuit 20 mentioned above, so the relative description is omitted hereinafter. The control circuit 33 comprises a first inverter 331 and a second inverter 332. The input end of the first inverter 331 is coupled to source ends of the auxiliary PMOS 32 and the second PMOS 312, the programming voltage VPP and the gate end of the first PMOS 311 together. The output end of the first inverter is coupled to the output end ZEN of the control circuit. The input end of the second inverter 332 is coupled to the output end ZEN of the control circuit. The output end of the second inverter 332 is coupled to the input end of the first inverter 331. As illustrated in FIG. 5, the control circuit 33, which comprises the first inverter 331 and the second inverter 332, forms a latch structure.

Please refer to FIG. 5 and FIG. 6 together. FIG. 6 is a table illustrating the voltage level of the output voltage VPPI under different conditions of the power voltage VDD and the programming voltage VPP for the power switch circuit 30 of the second embodiment of the present invention. When the voltage level of the power voltage VDD is 3.3V and the voltage level of the programming voltage VPP is 0V, the first transistor 311 is turned on, so the voltage level of the output voltage VPPI equals to that of the power voltage VDD, which is 3.3V. The input end of the control circuit 33 is coupled to the programming voltage VPP, so the control circuit 33 inverts the signal of the programming voltage VPP (0V) for the output end ZEN to output 3.3V and the auxiliary PMOS 32 is not turned on. When the voltage level of the power voltage VDD is 3.3V and the voltage level of the programming voltage VPP is 6.5V, the second transistor 32 is turned on. Further the control circuit 33 inverts the signal of the programming voltage VPP (6.5V) for the output end ZEN to output 0V, the auxiliary PMOS 32 is also turned on. Sine the source ends of the second PMOS 312 and the auxiliary PMOS 32 are both coupled to the programming voltage VPP, the voltage level of the output voltage VPPI equals to that of the programming voltage VPP, which is 6.5V. When both of the power voltage VDD and the programming voltage VPP are 3.3V, the first inverter 331 of the control circuit 33 performs logic inversion to the programming voltage VPP (3.3V) for the output end ZEN to output 0V, the auxiliary PMOS 32 is turned on accordingly. Consequently the output voltage VPPI is 3.3V. Similar to FIG. 3 described above, the voltage drop of the threshold voltage $V_{TP}$ of the first transistor 311 and the second transistor 312 can be eliminated as the current of the programming voltage VPP flows through the auxiliary PMOS 32. In other words, the output voltage VPPI is not (3.3V–$V_{TP}$), but 3.3V when both of the power voltage VDD and the programming voltage VPP are 3.3V.

The control circuit 33 having the first inverter 331 and the second inverter 332 is of a latch as mentioned above. Furthermore, the latch is structured such that the input end of the control circuit 33 (i.e. the input end of the first inverter 331) favors a low level state (i.e. low voltage level) and the output end ZEN of the control circuit 33 (i.e. the output end of the first inverter 331) favors a high level state (i.e. high voltage level), meaning the control circuit 33 pulls the input end of the control circuit 33 to a lower voltage level for the output end ZEN to be clamped to the voltage level of the power voltage VDD (i.e. 3.3V). Therefore, when the programming voltage VPP is floating, the control circuit 33 pulls down the voltage level of the programming voltage VPP such that eventually the voltage level of the programming voltage VPP is low enough to turn on the first transistor 311. Consequently the voltage level of the output voltage VPPI equals the voltage level of the power voltage VDD, which is approximately 3.3V in this embodiment.

In other words, when the programming voltage VPP has driving capability (e.g. When VPP is not floating), the power switch circuit 30 of the present invention operates so that the voltage level of the output voltage VPPI will trace a higher voltage of the power voltage VDD and the programming voltage VPP without a voltage drop. On the contrary, when the programming voltage VPP does not have driving capability (i.e. when VPP is floating), the power switch circuit 30 operates so that the output end ZEN of the control circuit (i.e. latch circuit) favors a high level state and is clamped to the voltage level of the power voltage VDD.

Figure 7:
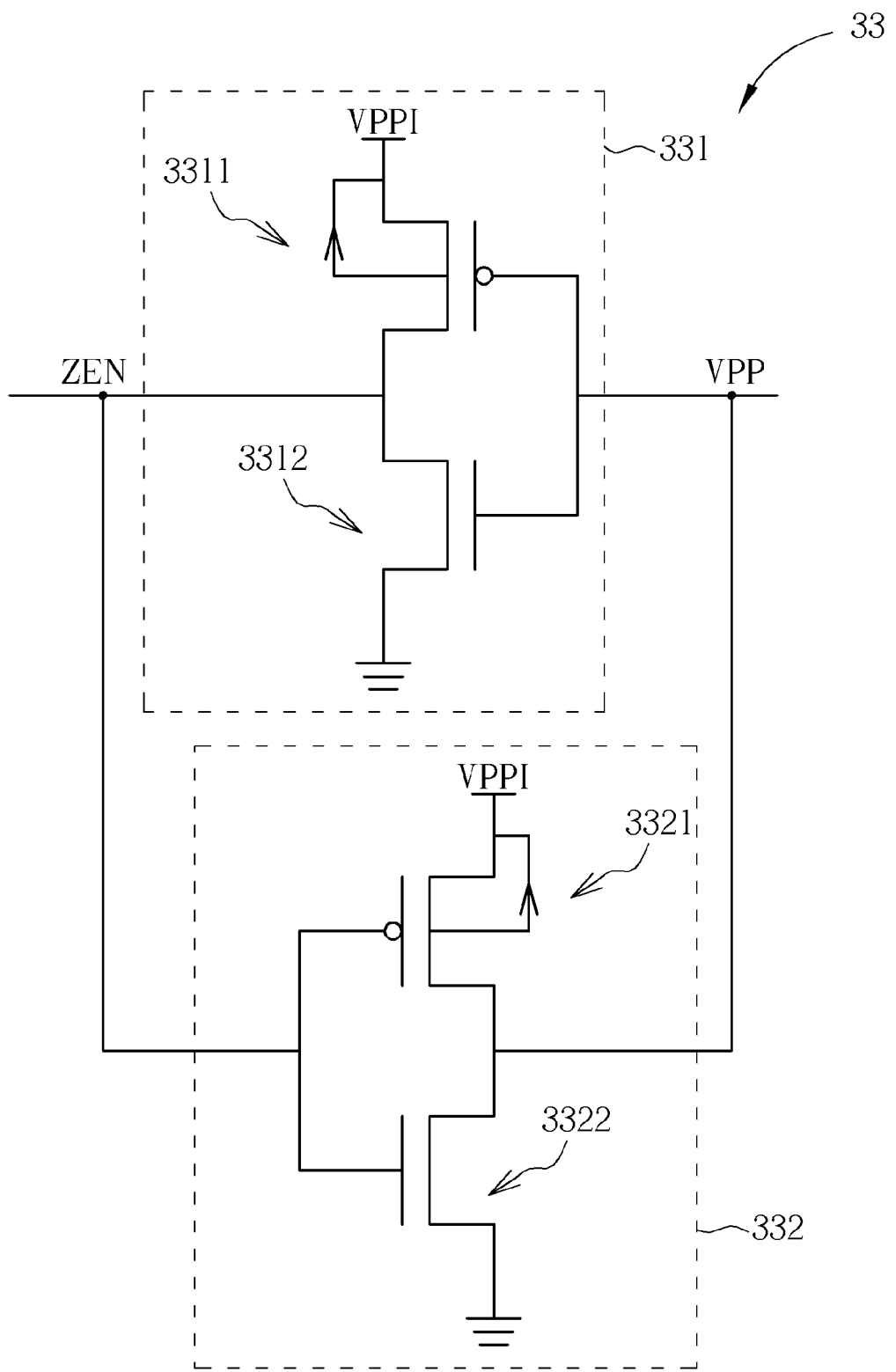
FIG. 7 is a diagram illustrating a control circuit of the power switch circuit in FIG. 5.

Please refer to FIG. 7. FIG. 7 is a diagram illustrating the control circuit 33 of the power switch circuit 30 of the second embodiment of the present invention. The first inverter 331 of the control circuit 33 comprises a third PMOS 3311 and a first NMOS 3312. The gate end of the third PMOS 3311 and the gate end of the first NMOS 3312 are coupled to the input end of the control circuit 33. The second inverter 332 of the control circuit 33 comprises a fourth PMOS 3321 and a second NMOS 3322. The gate end of the fourth PMOS 3321 and the gate end of the second NMOS 3322 are coupled to the output end ZEN of the control circuit 33. The source end of the third PMOS 3311 and the source end of the fourth PMOS 3321 are coupled to the drain end of the first PMOS 311 (i.e. equivalent to the output end VPPI). The drain end of the third PMOS 3311 is coupled to the drain end of the first NMOS 3312 and the output end ZEN of the control circuit 33. The source end of the first NMOS 3312 and the source end of the second NMOS 3322 are coupled to the ground. The drain end of the fourth PMOS 3321 is coupled to the drain end of the second NMOS 3322 and the input end of the control circuit 33. The body ends of the third PMOS 3311 and the fourth PMOS 3321 are both coupled to the drain end of the first PMOS 311 (i.e. the output end VPPI). The third PMOS 3311 is structured to dominate the first inverter 331, and the second NMOS 3322 is structured to dominate the second inverter 332, thus the input end of the control circuit 33 favors a low level state and the output end ZEN of the control circuit 33 favors a high level state. Moreover, the latch structure of the control circuit 33 can be constructed with NAND logic gates or other means, instead of inverters 331 and 332.

In conclusion, according to the embodiments of the present invention, the power switch circuit of the present invention comprises a voltage selecting circuit, an auxiliary transistor and a control circuit. The control circuit comprises an inverter, or a first inverter and a second inverter forming a latch. The power switch circuit is capable of tracing/selecting a higher supply voltage and outputting the voltage level of the higher supply voltage without a voltage drop, so the junction leakage can be eliminated and the drive capability of the power switch circuit is ensured.

Those skilled in the art will readily observe that numerous modifications and alterations of the device and method may be made while retaining the teachings of the invention.

What is claimed is:

1. A power switch circuit comprising:
   a voltage selecting circuit comprising:
      a first PMOS having a source end coupled to a first voltage source, a gate end coupled to a second voltage source, a drain end and a body end coupled to the drain end; and
      a second PMOS having a source end coupled to the second voltage source, a gate end coupled to the first voltage source, a drain end coupled to the drain end of the first PMOS, and a body end coupled to the drain end of the second PMOS;
   a control circuit having an input end coupled to the second voltage source; and
   a pass stage coupled to the voltage selecting circuit, the pass stage comprising an auxiliary PMOS having a source end coupled to the second voltage source, a gate end coupled to an output end of the control circuit, a drain end coupled to the drain end of the first PMOS, and a body end coupled to the drain end of the auxiliary PMOS.

2. The power switch circuit of claim 1 wherein the control circuit is a latch.

3. The power switch circuit of claim 2 wherein an output end of the latch favors a high voltage, and an input end of the latch favors a low voltage.

4. The power switch circuit of claim 1 wherein the control circuit comprises:
   a first inverter having an input end coupled to the second voltage source, and an output end coupled to the gate end of the auxiliary PMOS; and
   a second inverter having an input end coupled to the output end of the first inverter, and an output end coupled to the input end of the first inverter.

5. The power switch circuit of claim 4 wherein the first inverter
   comprises a third PMOS and a first NMOS, a gate end of the third PMOS and a gate end of the first NMOS are coupled to the input end of the control circuit, the second inverter comprises a fourth PMOS and a second NMOS, a gate end of the fourth PMOS and a gate end of the second NMOS are coupled to the output end of the control circuit.

6. The power switch circuit of claim 5 wherein a source end of the third PMOS and a source end of the fourth PMOS are coupled to the drain end of the first PMOS, a drain end of the third PMOS is coupled to a drain end of the first NMOS and the output end of the control circuit, a source end of the first NMOS and a source end of the second NMOS are coupled to ground, a drain end of the fourth PMOS is coupled to a drain end of the second NMOS and the input end of the control circuit, a body end of the third PMOS and a body end of the fourth PMOS are both coupled to the drain end of the first PMOS.

7. The power switch circuit of claim 1 wherein the first voltage source is a fixed power voltage, and the second voltage source is a variable programming voltage.

8. The power switch circuit of claim 1 wherein the control circuit comprises an inverter.

* * * * *